United States Patent
Matsuo

(10) Patent No.: US 7,098,517 B2
(45) Date of Patent: Aug. 29, 2006

(54) SEMICONDUCTOR DEVICE

(75) Inventor: Daisuke Matsuo, Hachioji (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 10/921,474

(22) Filed: Aug. 19, 2004

(65) Prior Publication Data
US 2005/0041278 A1  Feb. 24, 2005

(30) Foreign Application Priority Data
Aug. 21, 2003  (JP)  ............... 2003-297733

(51) Int. Cl.
*H01L 21/76* (2006.01)
(52) U.S. Cl. ............ 257/415; 257/432; 257/777; 257/784
(58) Field of Classification Search ............ 257/415, 257/432, 777–779, 782, 784
See application file for complete search history.

(56) References Cited

U.S. PATENT DOCUMENTS

| 5,581,123 | A | * | 12/1996 | Kozono | ............ 257/698 |
| 5,926,694 | A | * | 7/1999 | Chigawa et al. | ............ 438/106 |
| 6,307,452 | B1 | | 10/2001 | Sun | |
| 6,410,415 | B1 | * | 6/2002 | Estes et al. | ............ 438/612 |
| 6,519,075 | B1 | | 2/2003 | Carr et al. | |
| 6,690,885 | B1 | | 2/2004 | Aksyuk et al. | |
| 6,713,844 | B1 | * | 3/2004 | Tatsuta et al. | ............ 257/629 |
| 2002/0057506 | A1 | | 5/2002 | Kaneko | |

FOREIGN PATENT DOCUMENTS

| JP | 2-101402 | 4/1990 |
| JP | 2001-143595 | 5/2001 |
| JP | 2001-174724 | 6/2001 |
| JP | 2002-156514 | 5/2002 |

* cited by examiner

*Primary Examiner*—T. N. Quach
(74) *Attorney, Agent, or Firm*—Scully, Scott, Murphy & Presser, P.C.

(57) ABSTRACT

A semiconductor device has a first substrate and a second substrate. The first substrate has first electrodes on at least one surface. The second substrate has concave portions on a surface, and second electrodes provided on bottom surfaces of the concave portions. The semiconductor device further has metallic members located between the first electrodes of the first substrate and the second electrodes of the second substrate. The metallic members have a height greater than a depth of the concave portions of the second substrate, and electrically and mechanically bond the first electrodes of the first substrate and the second electrodes of the second substrate.

17 Claims, 4 Drawing Sheets

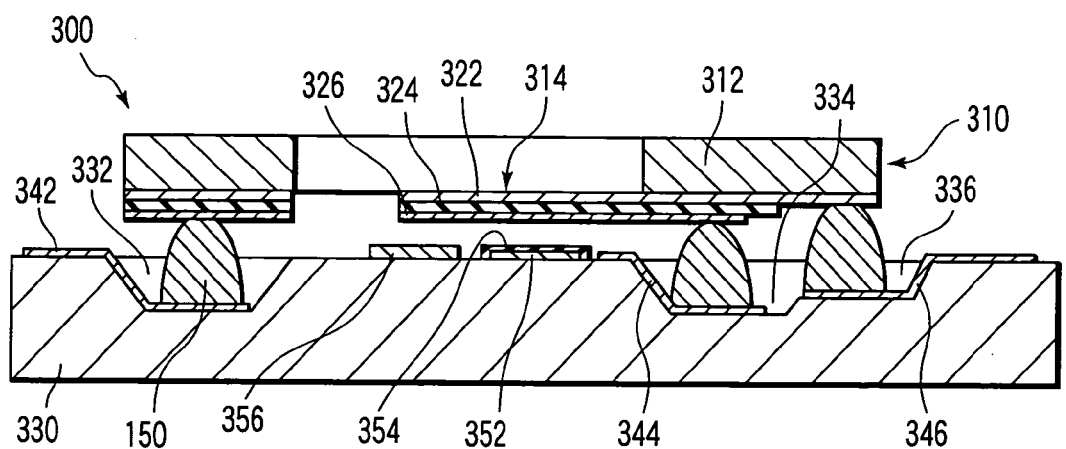
F I G. 8
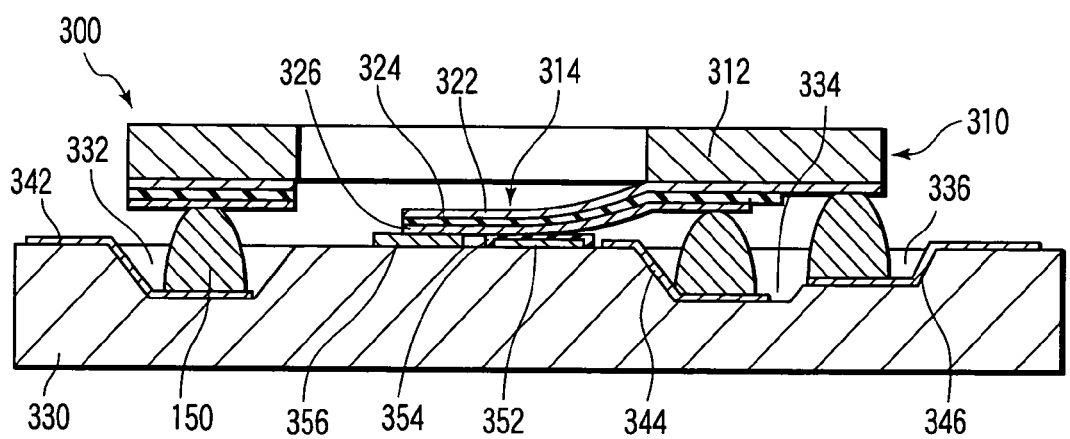
F I G. 9
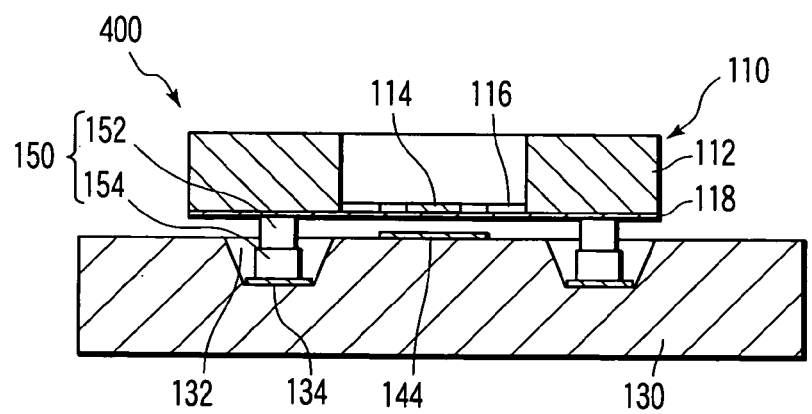
F I G. 10

Incident light  Out-going light

SEMICONDUCTOR DEVICE

CROSS-REFERENCE TO RELATED APPLICATIONS

This application is based upon and claims the benefit of priority from prior Japanese Patent Application No. 2003-297733, filed Aug. 21, 2003, the entire contents of which are incorporated herein by reference.

BACKGROUND OF THE INVENTION

1. Field of the Invention

The present invention relates to a semiconductor device constituted by a combination of substrates.

2. Description of the Related Art

U.S. Pat. No. 6,519,075,B2 discloses a technique that connects an electrostatically driven MEMS mirror array obtained by processing a semiconductor substrate to connection pads of another substrate provided with an actuator electrode by use of a solder ball (solder bump). FIG. 13 shows a semiconductor device manufactured in such a manner.

This semiconductor device has a mirror layer 20 and an actuator layer 23. The mirror layer 20 has surrounding frames 22, and gimbaled mirrors 21 allowed to incline with respect to the surrounding frames 22. On the other hand, the actuator layer 23 has actuator electrodes 24 to actuate the mirrors 21. The mirror layer 20 and the actuator layer 23 both have metallization regions 25, and the metallization regions 25 of the mirror layer 20 and the metallization regions 25 of the actuator layer 23 are bonded by the solder balls 26.

BRIEF SUMMARY OF THE INVENTION

The present invention is directed to a semiconductor device comprising a combination of at least two substrates. The semiconductor device of the present invention has a first substrate and a second substrate. The first substrate has first electrodes on at least one surface. The second substrate has concave portions on a surface, and second electrodes provided on bottom surfaces of the concave portions. The semiconductor device further has metallic members located between the first electrodes of the first substrate and the second electrodes of the second substrate. The metallic members have a height greater than a depth of the concave portions of the second substrate, and electrically and mechanically bond the first electrodes of the first substrate and the second electrodes of the second substrate.

Advantages of the invention will be set forth in the description which follows, and in part will be obvious from the description, or may be learned by practice of the invention. Advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 8 is a sectional view of an MEMS high frequency switch, which is the semiconductor device in a third embodiment of the present invention, in which a switch is in an off-state;

FIG. 9 is a sectional view of the MEMS high frequency switch, which is the semiconductor device in the third embodiment of the present invention, in which the switch is in an on-state;

FIG. 10 is a sectional view of the MEMS deflecting mirror, which is the semiconductor device in a fourth embodiment of the present invention;

DETAILED DESCRIPTION OF THE INVENTION

Figure 1:
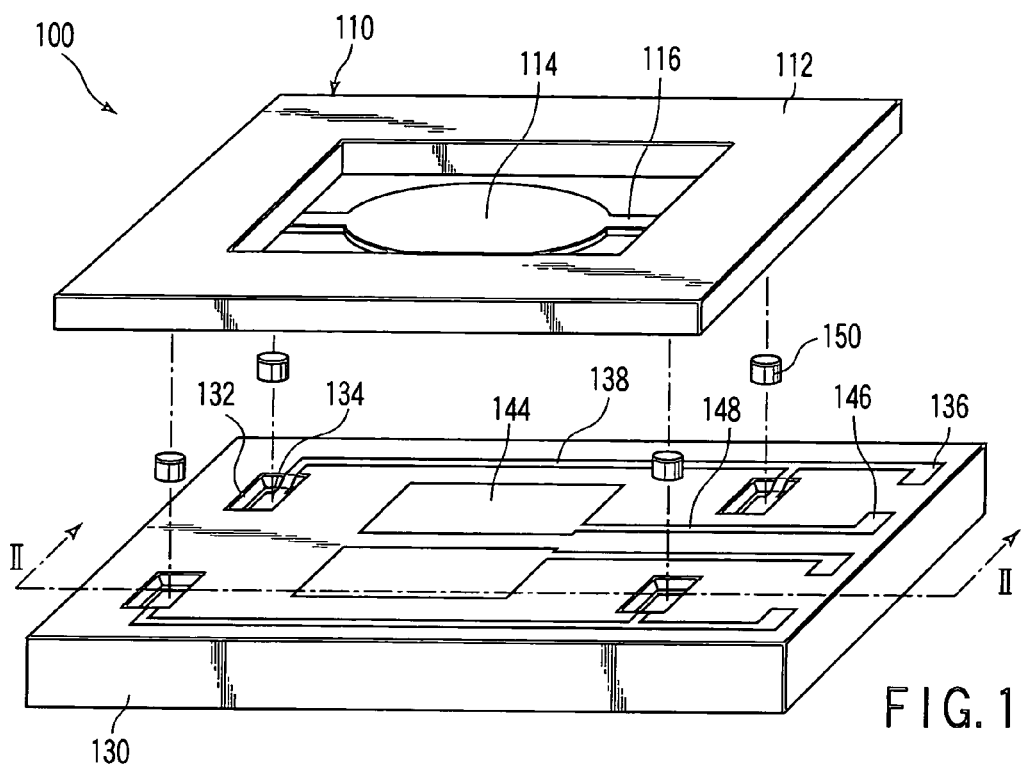
FIG. 1 is an exploded perspective view of an MEMS deflecting mirror, which is a semiconductor device in a first embodiment of the present invention.

Embodiments of the present invention will hereinafter be described referring to the drawings.

First Embodiment

The present embodiment is directed to an MEMS deflecting mirror. Details of the MEMS deflecting mirror are disclosed in U.S. Pat. No. 6,519,075,B2 and the like.

Figure 2:
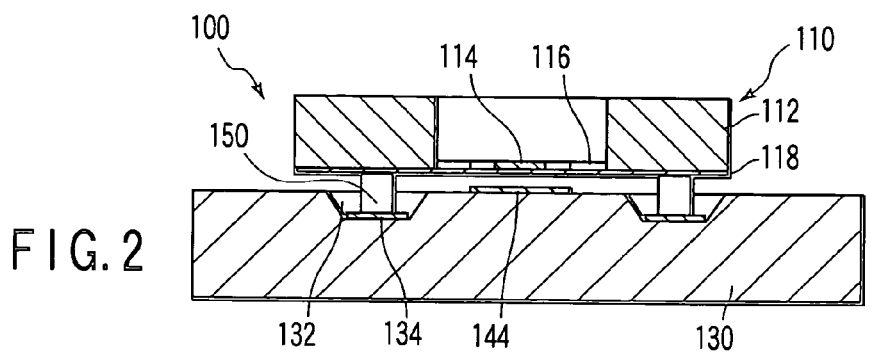
FIG. 2 is a sectional view of the MEMS deflecting mirror along the line II—II indicated in FIG. 1.

FIG. 1 is an exploded perspective view of the MEMS deflecting mirror, which is a semiconductor device in a first embodiment of the present invention. FIG. 2 is a sectional view of the MEMS deflecting mirror along the line II—II indicated in FIG. 1.

As shown in FIG. 1 and FIG. 2, a semiconductor device 100 comprises a mirror substrate 110, a wiring substrate 130 located to face the mirror substrate 110, and metallic members 150 bonding the mirror substrate 110 and the wiring substrate 130.

The mirror substrate 110 is a substrate that is manufactured by subjecting a silicon substrate to micro fabrications such as etching and coating and forming electrodes and wires thereon in accordance with an MEMS technique.

The mirror substrate 110 comprises a frame member 112, a movable mirror 114, and two hinges 116 connecting the frame member 112 and the movable mirror 114. The hinges 116 are torsionally deformable, so that the movable mirror 114 is allowed to swing with respect to the frame member 112 on the hinges 116. Thus, the movable mirror 114 constitutes a movable portion that mechanically operates. The movable mirror 114 has a reflective surface on its upper surface (surface opposite to the wiring substrate 130). The reflective surface may be, for example, a surface of a highly reflective film that is separately provided on the upper surface of the movable mirror 114.

The wiring substrate 130 has concave portions 132 on a surface facing the mirror substrate 110. For example, the wiring substrate 130 is made of silicon, and the concave portions 132 are formed by wet etching.

The wiring substrate 130 further has electrodes 134 provided on bottom surfaces of the concave portions 132, electrode pads 136 provided at an end of an upper surface of the wiring substrate 130 for electric connection to the outside, and wires 138 electrically connecting the electrodes 134 and the electrode pads 136. Electrodes 134, an electrode pad 136, and a wire 138 that are continuous are formed by the same conductive thin film.

The wiring substrate 130 further has two actuator electrodes 144 provided in a part that faces the movable mirror 114 of the mirror substrate 110, electrode pads 146 provided at an end of the upper surface of the wiring substrate 130 for electric connection to the outside, and wires 148 electrically connecting the actuator electrodes 144 and the electrode pads 146. An actuator electrode 144, an electrode pad 146, and a wire 148 that are continuous are formed by the same conductive thin film.

The two actuator electrodes 144 are spaced apart, and the space is located directly under the hinges 116 of the mirror substrate 110 and extends along the hinges 116 of the mirror substrate 110.

As shown in FIG. 2 in particular, the mirror substrate 110 further has a conductive thin film 118 on a surface facing the wiring substrate 130. The conductive thin film 118 expands over a part covering the frame member 112, the movable mirror 114 and the hinges 116. A part of the conductive thin film 118 located on the movable mirror 114 constitutes a mirror electrode to exert a driving force that swings the movable mirror 114. Parts of the conductive thin film 118 located on the frame member 112 constitute electrodes for electric conduction to the electrodes 134 of the wiring substrate 130. Parts of the conductive thin film 118 located on the hinges 116 constitute wires that electrically connect the electrode on the movable mirror 114 and the electrode on the frame member 112.

As shown in FIG. 2 in particular, the metallic members 150 have a height greater than a depth of the concave portions 132 of the wiring substrate 130. The metallic members 150 are bumps made of, for example, gold, and are provided between the electrodes 134 provided on the bottom surfaces of the concave portions 132 of the wiring substrate 130, and parts of the conductive thin film 118 located on the frame member 112 of the mirror substrate 110. The bumps 150 are pressure-welded with heat to electrically and mechanically bond the electrodes 134 provided on the bottom surfaces of the concave portions 132 of the wiring substrate 130 and the parts of the conductive thin film 118 located on the frame member 112 of the mirror substrate 110.

The semiconductor device 100 is manufactured, for example, as follows. First, the bumps 150 made of, for example, gold are formed by use of a bump bonder at predetermined positions in the parts of the conductive thin film 118 on the frame member 112 of the mirror substrate 110. Next, the mirror substrate 110 is fixed on a stage of a flip chip bonder so that the bumps 150 turn upward. Then, the wiring substrate 130 is stuck to a mounting head and positioned so that the actuator electrodes 144 of the wiring substrate 130 properly face the movable mirror 114 of the mirror substrate 110. In this state, the electrodes 134 provided in the concave portions 132 of the wiring substrate 130 also properly face the bumps 150 formed on the mirror substrate 110. Next, hot pressure welding (heating and pressurization) is performed to connect the bumps 150 and the electrodes 134 on the bottom surfaces of the concave portions 132.

In the semiconductor device 100 thus manufactured, the conductive thin film 118 provided on the mirror substrate 110 is electrically connected by the bumps 150 to the electrodes 134 provided on the bottom surfaces of the concave portions 132 of the wiring substrate 130. The electrodes 134 are electrically connected to the electrode pads 136 through the wires 138. Thus, the electrode pads 136 are connected to a ground, so that potentials of the movable mirror 114 and the conductive thin film 118 will be 0.

If a voltage is applied to an actuator electrode 144 in this state, electrostatic attraction is produced between the actuator electrode 144 and the part of the conductive thin film 118 on the movable mirror 114, that is, the mirror electrode, and the movable mirror 114 is inclined (deflected) on the hinges 116.

The electrostatic attraction rapidly decreases as the distance between the movable mirror 114 and the actuator electrode 144 increases. Thus, if the distance between the movable mirror 114 and the actuator electrode 144 is large, a significantly high voltage is needed to provide a predetermined inclination to the movable mirror 114. A large power supply is needed to obtain the significantly high voltage. Moreover, the significantly high voltage might exceed a limit of dielectric breakdown to break the MEMS.

Therefore, in a configuration in which concave portions are not formed as that of U.S. Pat. No. 6,519,075,B2, the height of the bumps increases the distance between the mirror substrate and the wiring substrate.

Contrarily, in the semiconductor device of the present embodiment, because the concave portions 132 are formed in the wiring substrate 130, the distance between the mirror substrate 110 and the wiring substrate 130, that is, the distance between the mirror electrode and the actuator electrodes 144 is reduced owing to the height of the bumps 150. This makes it possible to reduce a required drive voltage.

Furthermore, if the mirror substrate 110 is directly bonded to the wiring substrate 130, the movable mirror 114 contacts the wiring substrate 130 when the movable mirror 114 is inclined, and does not function as the deflecting mirror.

In the present embodiment, the substrates are connected by the hot pressure welding of the bumps, and resins such as adhesives and anisotropic conductive pastes or films are not used, so that the function of the MEMS is not impaired by outward flowing or running of the resins.

In addition, the bumps ensure that the mirror electrode and the movable mirror 114 are electrically connected to the ground.

As has been described so far, in the present embodiment, in the semiconductor device in which the substrates are affixed together, the concave portions are formed in the wiring substrate, so that the proper space can be provided between the substrates and that the electric connection can be achieved in all the bumps.

As a result, it is possible to obtain a semiconductor device such as the MEMS device with a low operating voltage and less fear of breakage.

The present embodiment is not limited to the configuration described above, and various modifications and alterations may be made.

The silicon substrate processed as a semiconductor substrate has been described as an example in the present embodiment, but various materials that enable the micro fabrication such as chemical or physical etching and wiring formation can be selected for the substrate.

Furthermore, in the case of the gold bump, a stud bump, a plated bump or the like is applicable. The material of the bump is not exclusively limited to gold but may be a conductive metal, and for example, lead-tin solder, AuSn solder or In (indium) solder is also applicable.

It is important that the material of the electrodes on the surfaces of the substrates to be connected by the metallic members is selected in accordance with the metallic members to be applied. A gold electrode is most suitable for the gold bump, and aluminum, nickel, titanium, copper or the like is also applicable. Portions near surfaces of the electrodes are preferably made of a conductive material that has satisfactory mutual diffusibility with gold when gold is connected to the electrodes. A proper selection for the material of the electrode improves anti-reflow properties and heat resisting properties of the substrate and enables the substrate to be subjected to reflow-treatment later. Moreover, if the bump is solder, a material having satisfactory leakage properties into the solder is usefully formed on an uppermost surface of the electrode.

The substrates are bonded by the hot pressure welding, but supersonic waves may be added as required in the hot pressure welding. In this case, effects of compatibility between the materials to be bonded can be reduced, thus providing such anticipated benefits as more freedom in the combination of the material of the electrode and the material of the metallic members, and a lower heating temperature.

Figure 3:
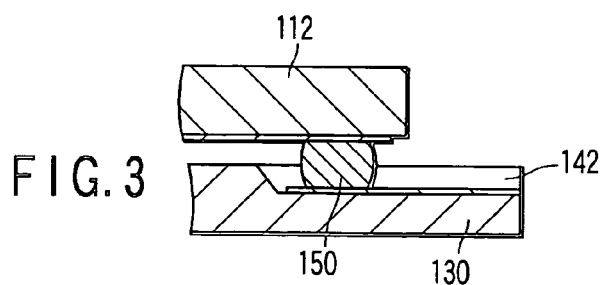
FIG. 3 shows an alternative embodiment applicable in place of concave portions shown in FIG. 1 and FIG. 2.

Furthermore, in the above description, the concave portion 132 is totally surrounded at a portion lower than the upper surface of the wiring substrate 130 (i.e., the bottom surface) as shown in FIG. 1 and FIG. 2, but the concave portion 132 is not limited to this form and may be in a form where the portion lower than the upper surface of the wiring substrate 130 extends to an edge of the wiring substrate 130, that is, a step 142, as shown in FIG. 3. When the concave portion 132 is the step 142, the same advantages as described above can also be provided.

Application of the First Embodiment

Figure 4:
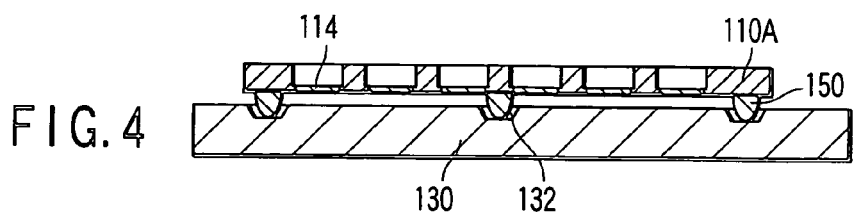
FIG. 4 shows an application of the semiconductor device in the first embodiment.

The present application is directed to arraying of the semiconductor devices including the MEMS deflecting mirrors described above. FIG. 4 shows an application of the semiconductor device in the first embodiment. In FIG. 4, members indicated by the same reference numerals as those of the members shown in FIG. 1 and FIG. 2 are the same and will not be described in detail.

The deflecting mirror can be manufactured as the MEMS in a semiconductor process, so that a mirror array 110A in which an array of the movable mirrors 114 is formed is produced and connected to the concave portions 132 of the wiring substrate 130 by use of the bumps 150, thereby enabling an MEMS deflecting mirror array to be obtained.

Such a mirror array is useful in configuring a large-scale optical switch as in U.S. Pat. No. 6,690,885,B1, for example.

In the present application, the bumps are formed in the concave portions, so that even in a large-scale array in which connection probability of the bumps tends to be lower due to an inclination error in the substrates caused by the increase in the size of the substrates, all the bumps can achieve secure connection and the distance between the substrates can be reduced, thus making it possible to reduce the operating voltage.

The arrayed devices need electric circuits such as control amplifiers to be drive voltage sources of deflectors corresponding to the number of arrays, and the size and cost of the amplifiers greatly vary depending on a required voltage, so that the reduction of the drive voltage is also effective in the reduction of size and cost of a whole drive circuit device.

In the present application, the number of bumps 150 is increased as the scale of the array is enlarged, but the concave portions are preformed in parts where the bumps are connected to further ensure that all the bumps achieve connection.

Second Embodiment

The present embodiment is directed to an MEMS deformable mirror. The MEMS deformable mirror is a device that can change the curvature of the mirror thin film portion by use of the electrostatic attraction between the electrode of the mirror thin film portion and the actuator electrode, for example, as disclosed in US Pat. Appln. KOKAI Publication No. 2002/0057506 A1.

Figure 5:
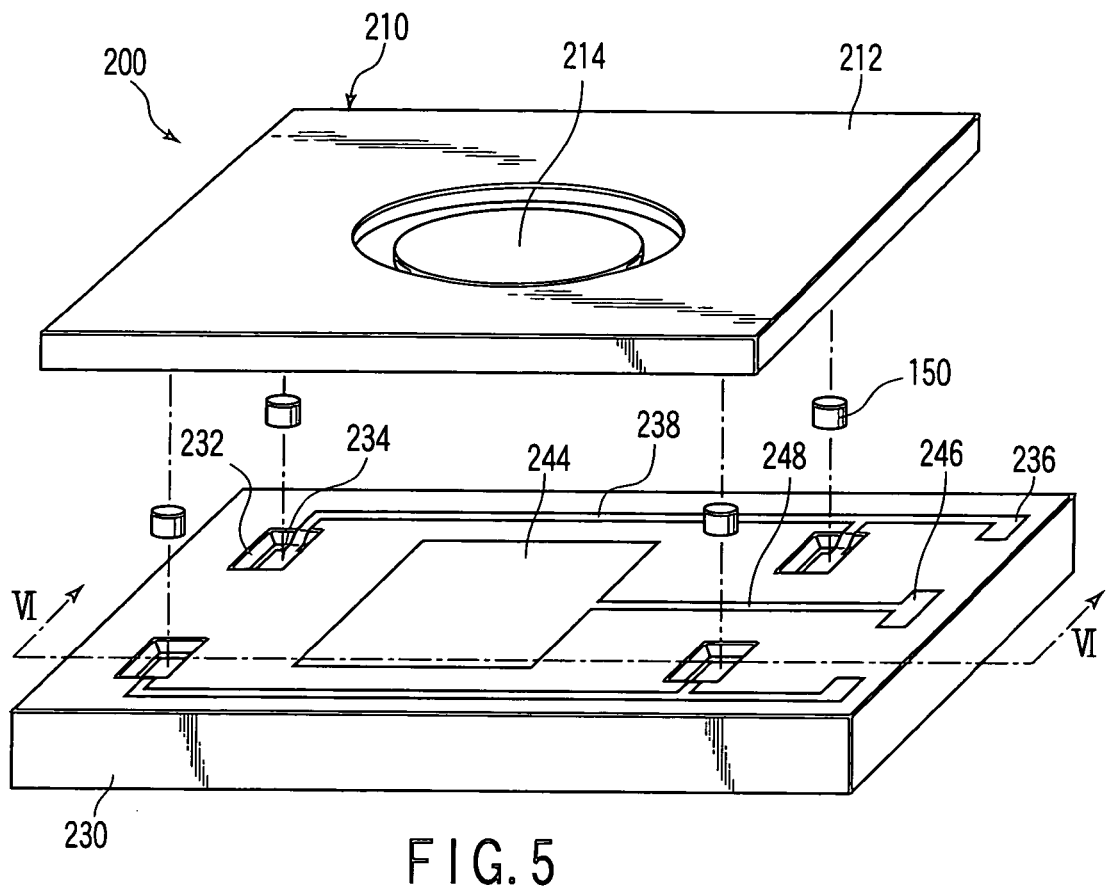
FIG. 5 is an exploded perspective view of an MEMS deformable mirror, which is the semiconductor device in a second embodiment of the present invention.
Figure 6:
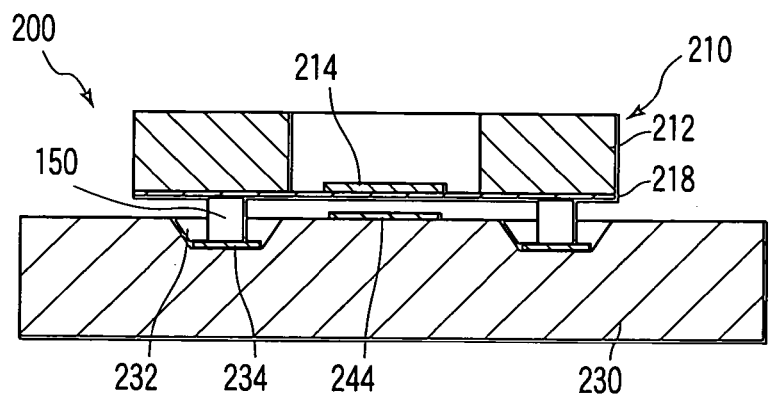
FIG. 6 is a sectional view of the MEMS deformable mirror along the line VI—VI indicated in FIG. 5.

FIG. 5 is an exploded perspective view of the MEMS deformable mirror, which is the semiconductor device in a second embodiment of the present invention. FIG. 6 is a sectional view of the MEMS deformable mirror along the line VI—VI indicated in FIG. 5.

As shown in FIG. 5 and FIG. 6, a semiconductor device 200 comprises a mirror substrate 210, a wiring substrate 230 located to face the mirror substrate 210, and the metallic members 150 bonding the mirror substrate 210 and the wiring substrate 230.

The mirror substrate 210 comprises a frame member 212 having an opening, a deformable mirror 214 located in the opening of the frame member 212, and a conductive thin film 218 connecting the frame member 212 and the deformable mirror 214. The mirror substrate 210 is manufactured from a semiconductor substrate such as a silicon substrate, for example, by an MEMS technique.

The deformable mirror 214 has a reflective surface on its upper surface (surface opposite to the wiring substrate 230). The deformable mirror 214 can easily deform together with a part of the conductive thin film 218 located in the opening of the frame member 212, so as to change the curvature of its reflective surface. That is, the deformable mirror 214 constitutes a movable portion that mechanically operates.

The wiring substrate 230 has concave portions 232 on a surface facing the mirror substrate 210. For example, the wiring substrate 230 is made of silicon, and the concave portions 232 are formed by wet etching.

The wiring substrate 230 further has electrodes 234 provided on bottom surfaces of the concave portions 232, electrode pads 236 provided at an end of an upper surface of the wiring substrate 230 for electric connection to the outside, and wires 238 electrically connecting the electrodes 234 and the electrode pads 236. Electrode 234, an electrode pad 236, and a wire 238 that are continuous are formed by the same conductive thin film.

The wiring substrate 230 further has an actuator electrode 244 provided in a part that faces the deformable mirror 214 of the mirror substrate 210, an electrode pad 246 provided at an end of the upper surface of the wiring substrate 230 for electric connection to the outside, and a wire 248 electrically connecting the actuator electrode 244 and the electrode pad 246. The actuator electrode 244, electrode pad 246, and wire 248, which are continuous, are formed by the same conductive thin film.

As shown in FIG. 6, the conductive thin film 218 traverses the opening of the frame member 212, and expands on an entire lower surface of the frame member 212. A part of the conductive thin film 218 located on the deformable mirror 214 constitutes a mirror electrode to exert a driving force that swings the deformable mirror 214. Parts of the conductive thin film 218 located on the frame member 212 constitute electrodes for electric conduction to the electrodes 234 of the wiring substrate 230. A part of the conductive thin film 218 located between the deformable mirror 214 and the frame member 212 supports the deformable mirror 214, and functions as a wire to electrically connect the electrode on the deformable mirror 214 to the electrode on the frame member 212.

As shown in FIG. 6, the metallic members 150 have a height greater than a depth of the concave portions 232 of the wiring substrate 230. The metallic members 150 are bumps made of, for example, gold, and are provided between the electrodes 234 provided on the bottom surfaces of the concave portions 232 of the wiring substrate 230 and the parts of the conductive thin film 218 located on the frame member 212 of the mirror substrate 210. The bumps 150 are pressure-welded with heat to electrically and mechanically bond the electrodes 234 provided on the bottom surfaces of the concave portions 232 of the wiring substrate 230 and the parts of the conductive thin film 218 located on the frame member 212 of the mirror substrate 210.

In the semiconductor device 200 thus manufactured, the conductive thin film 218 provided on the mirror substrate 210 is electrically connected by the bumps 150 to the electrodes 234 provided on the bottom surfaces of the concave portions 232 of the wiring substrate 230. The electrodes 234 are electrically connected to the electrode pads 236 through the wires 238. Thus, the electrode pads 236 are connected to the ground, so that potentials of the deformable mirror 214 and the conductive thin film 218 will be 0.

If a voltage is applied to the actuator electrode 244 in this state, the electrostatic attraction is produced between the actuator electrode 244 and the part of the conductive thin film 218 on the deformable mirror 214, that is, the mirror electrode, and the deformable mirror 214 deforms into a concave shape to change the curvature of the reflective surface.

As has already been described in the first embodiment, the electrostatic attraction rapidly decreases as the distance between the deformable mirror 214 and the actuator electrode 244 increases. Thus, if the distance between the deformable mirror 214 and the actuator electrode 244 is large, a significantly high voltage is needed to deform the deformable mirror 214 into a predetermined shape. A large power supply is needed to obtain the significantly high voltage. Moreover, the significantly high voltage might exceed a limit of dielectric breakdown to break the MEMS.

Especially, as the deformable mirror does not have a less elastic part such as the hinges in the deflecting mirror, its drive voltage tends to be high.

In the semiconductor device of the present embodiment, because the concave portions 232 are formed in the wiring substrate 230, the distance between the mirror substrate 210 and the wiring substrate 230, that is, the distance between the mirror electrode and the actuator electrode 244 can be smaller than the height of the bumps 150. This makes it possible to reduce a required drive voltage.

On the other hand, in order to deform the deformable mirror 214 into the predetermined shape, it is necessary to secure a distance corresponding to the predetermined shape between the deformable mirror 214 and the actuator electrode 244. Especially in an electrostatically driven deformable mirror, an amount of deformation of the deformable mirror is generally reduced to one third of an initial space between the deformable mirror and the actuator electrode to avoid a pull-in phenomenon wherein the deformable mirror totally contacts the actuator electrode. Thus, the deformable mirror 214 and the actuator electrode 244 need to be separated three times as much as the deformation amount of the deformable mirror 214.

After all, the distance between the deformable mirror 214 and the actuator electrode 244 is desirably adjusted to a proper value in accordance with a design in view of the amount of the drive voltage and the deformation amount of the deformable mirror 214. Moreover, an optimum value of the distance between the deformable mirror 214 and the actuator electrode 244 is usually smaller than the height of the bumps.

In the semiconductor device of the present embodiment, the initial distance between the deformable mirror 214 and the actuator electrode 244 can be brought to the optimum value by the metallic members 150 such as the gold bumps and the concave portions 232 formed in the wiring substrate 230 and also by controlling pressurization applied when the mirror substrate 210 and the wiring substrate 230 are bonded.

In the present embodiment, the substrates are connected by the hot pressure welding of the bumps, and resins such as adhesives and anisotropic conductive pastes or films are not used, so that the function of the MEMS is not impaired by outward flowing or running of the resins.

As has been described so far, in the present embodiment, in the semiconductor device in which the substrates are affixed together, the concave portions are formed in the wiring substrate, so that the proper space can be provided between the substrates and the electric connection can be achieved in all the bumps.

As a result, it is possible to obtain a semiconductor device such as the MEMS device with a low operating voltage and less fear of breakage.

The present embodiment is not limited to the configuration described above, and various modifications and alterations may be made.

The various modifications described in the first embodiment can be applied to the materials of the substrate, the bump and the electrode. As also described in the first embodiment, the supersonic waves may be added as required in the hot pressure welding of the substrates. Moreover, the modifications described in the first embodiment can be applied to the form of the concave portion 232. Thus, the concave portion 232 may be in a form (the step 142) where the portion lower than the upper surface of the wiring substrate extends to the edge of the wiring substrate as shown in FIG. 3.

Application of the Second Embodiment

Figure 7:
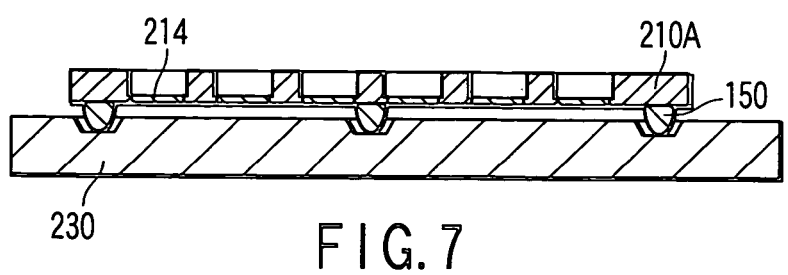
FIG. 7 shows an application of the semiconductor device in the second embodiment.

This application is directed to the arraying of the semiconductor devices including the MEMS deformable mirrors described above. FIG. 7 shows an application of the semiconductor device in the second embodiment. In FIG. 7, members indicated by the same reference numerals as those of the members shown in FIG. 5 and FIG. 6 are the same and will not be described in detail.

The deformable mirror can be manufactured as the MEMS in the semiconductor process, so that a mirror array 210A in which an array of the deformable mirrors 214 is formed is produced and connected to the concave portions 232 of the wiring substrate 230 by use of the bumps 150, thereby enabling an MEMS deformable mirror array to be obtained. Such a device is particularly useful in an image display device or the like.

In the present application, the bumps are formed in the concave portions, so that even in a large-scale array in which connection probability of the bumps tends to be lower due to an inclination error in the substrates caused by the increase in the size of the substrates, all the bumps can achieve secure connection and the distance between the substrates can be reduced, thus making it possible to reduce the operating voltage.

The arrayed devices need electric circuits such as the control amplifiers to be drive voltage sources of the deflectors corresponding to the number of arrays are needed, the size and cost of the amplifiers greatly vary depending on a required voltage, so that the reduction of the drive voltage is also effective in the reduction of size and cost of the whole drive circuit device.

In the present application, the number of bumps 150 is increased as the scale of the array is enlarged, but the concave portions are preformed in parts where the bumps are connected to further ensure that all the bumps achieve connection.

Third Embodiment

The present embodiment is directed to an MEMS high frequency switch. The MEMS high frequency switch is disclosed in U.S. Pat. No. 6,307,452,B1 and the like. Operation of the MEMS high frequency switch of the present embodiment is basically similar to that of a device disclosed in U.S. Pat. No. 6,307,452,B1.

FIG. 8 and FIG. 9 are sectional views of the MEMS high frequency switch, which is the semiconductor device in a third embodiment of the present invention, and FIG. 8 shows the switch in an off-state and FIG. 9 shows the switch in an on-state.

As shown in FIG. 8 and FIG. 9, a semiconductor device 300 comprises a switch substrate 310, a wiring substrate 330 located to face the switch substrate 310, and the metallic members 150 bonding the switch substrate 310 and the wiring substrate 330.

The switch substrate 310 comprises a frame member 312 having an opening, and an MEMS cantilever 314 extending from the frame member 312 into the opening. The MEMS cantilever 314 comprises an aluminum thin film 322, an insulating support thin film 324, and an aluminum thin film 326, which are laminated in order on a bottom surface of the frame member 312. The switch substrate 310 is manufactured from a semiconductor substrate such as a silicon substrate, for example, by the MEMS technique.

The MEMS cantilever 314 is elastically deformable, so as to displace its free end up and down. Thus, the MEMS cantilever 314 constitutes a movable portion that mechanically operates. Moreover, a part of the aluminum thin film 322 located on the MEMS cantilever 314 constitutes an electrode to exert a driving force that operates the MEMS cantilever 314.

The aluminum thin film 322 extends to an end of the frame member 312, while the support thin film 324 and the aluminum thin film 326 terminate at the midpoint of the frame member 312. Therefore, the aluminum thin film 322 is exposed at the end of the frame member 312.

The wiring substrate 330 has a concave portion 332, a concave portion 334, and a concave portion 336 on a surface facing the switch substrate 310. For example, the wiring substrate 330 is made of silicon, and the concave portion 332, the concave portion 334, and the concave portion 336 are formed by wet etching.

The wiring substrate 330 further has a conductive thin film 342 extending between a bottom surface of the concave portion 332 and an upper surface of the wiring substrate 330, a conductive thin film 344 extending between a bottom surface of the concave portion 334 and the upper surface of the wiring substrate 330, and a conductive thin film 346 extending between a bottom surface of the concave portion 336 and the upper surface of the wiring substrate 330.

A part of the conductive thin film 342 located on the bottom surface of the concave portion 332 constitutes an electrode for conduction to the aluminum thin film 326. Similarly, a part of the conductive thin film 344 located on the bottom surface of the concave portion 334 constitutes an electrode for conduction to the aluminum thin film 326. Moreover, a part of the conductive thin film 346 located on the bottom surface of the concave portion 336 constitutes an electrode for conduction to the aluminum thin film 322.

Accordingly, on the side of the switch substrate 310, a part of the aluminum thin film 322 exposed at the end of the frame member 312 constitutes an electrode for conduction to the conductive thin film 346. Further, a part of the aluminum thin film 326 located on the frame member 312 constitutes an electrode for conduction between the conductive thin film 342 and the conductive thin film 344.

The concave portion 332 and the concave portion 334 has the same depth, and the concave portion 336 is shallower than the concave portion 332 and the concave portion 334 by a level difference produced by the aluminum thin film 322 and the aluminum thin film 326, that is, by the thickness of the support thin film 324 and the aluminum thin film 326. Therefore, a space between the part of the conductive thin film 342 located on the bottom surface of the concave portion 332 and the aluminum thin film 326, a space between the part of the conductive thin film 344 located on the bottom surface of the concave portion 334 and the aluminum thin film 326, and a space between the part of the conductive thin film 346 located on the bottom surface of the concave portion 336 and the aluminum thin film 322 are all equal.

In FIG. 8 and FIG. 9, the concave portion 334 and the concave portion 336 are continued from each other. Thus, the concave portion 334 and the concave portion 336 constitute one large concave portion having two bottom parts of different depths in a sense. However, in the present specification, the concave portion having the bottom parts of different depths is regarded as plural concave portions to focus attention on the difference of depth in the bottom parts.

Naturally, the concave portion 334 and the concave portion 336 do not need to be continuous and may be separated from each other. In other words, the concave portion 334 and the concave portion 336 may be independent concave portions.

The wiring substrate 330 further has an actuator electrode 352, a protection film 354 covering the actuator electrode 352, and a contact electrode 356. The actuator electrode 352 and the contact electrode 356 are both provided at locations facing the MEMS cantilever 314 of the switch substrate 310.

The metallic members 150 are provided between the part of the conductive thin film 342 located on the bottom surface of the concave portion 332 and the aluminum thin film 326, between the part of the conductive thin film 344 located on the bottom surface of the concave portion 334 and the aluminum thin film 326, and between the part of the conductive thin film 346 located on the bottom surface of the concave portion 336 and the aluminum thin film 322. These metallic members 150 have an equal height, and a height greater than the depth of the concave portion 332 and the concave portion 334 of the wiring substrate 330.

The metallic members 150 are bumps made of, for example, gold, and are pressure-welded with heat to mechanically bond the switch substrate 310 and the wiring substrate 330 and electrically bond the electrodes of the switch substrate 310 and the wiring substrate 330.

The semiconductor device 300 is manufactured, for example, as follows.

For example, starting with an SOI substrate, processes such as resist patterning, etching and thin film formation are performed to configure a micro MEMS structure, thereby manufacturing the switch substrate 310.

On the other hand, the concave portion 332, the concave portion 334, and the concave portion 336 that have proper depths are formed in the wiring substrate 330 in view of the level difference produced by the aluminum thin film 322 and the aluminum thin film 326 on the switch substrate 310.

Next, on the wiring substrate 330, the actuator electrode 352, the contact electrode 356, the conductive thin film 342, the conductive thin film 344 and the conductive thin film 346 are formed, and the protection film 354 is formed if necessary.

Subsequently, the bumps 150 made of, for example, gold are formed on the electrodes provided on the bottom surfaces of the concave portion 332, the concave portion 334, and the concave portion 336.

Finally, the switch substrate 310 is pressure-welded with heat to the wiring substrate 330 to complete the MEMS high frequency switch.

In the semiconductor device 300, the aluminum thin film 322 provided on the switch substrate 310 is electrically connected by the bump 150 to the part of the conductive thin film 346 provided on the bottom surface of the concave portion 336 of the wiring substrate 330. The conductive thin film 346 is connected to the ground. Thereby, the aluminum thin film 322 of the switch substrate 310 is satisfactorily maintained at a ground potential. Moreover, a signal is supplied to the conductive thin film 344 (or the conductive thin film 342).

If a voltage is applied to the actuator electrode 352 in this state, the electrostatic attraction is produced between the actuator electrode 352 and a part of the aluminum thin film 322 facing the actuator electrode 352. As a result, the aluminum thin film 322, that is, the MEMS cantilever 314 is drawn to the actuator electrode 352, and the aluminum thin film 326 contacts the contact electrode 356. Consequently, the contact electrode 356 and the conductive thin film 344 (or the conductive thin film 342) are electrically connected.

Furthermore, if the application of the voltage to the actuator electrode 352 is stopped, the electrostatic attraction between the actuator electrode 352 and the aluminum thin film 322 disappears, so that the MEMS cantilever 314 returns to an original shape, with the result that the contact electrode 356 and the conductive thin film 344 (or the conductive thin film 342) are electrically disconnected.

Thus, the voltage application to the actuator electrode 352 can be performed or stopped to allow or stop a signal flow between the contact electrode 356 and the conductive thin film 344 (or the conductive thin film 342).

In the present embodiment, the concave portions are provided in the parts of the wiring substrate 330 where the bumps 150 are provided, so that a space between the switch substrate 310 and the wiring substrate 330 can be reduced. This allows the distance between the aluminum thin film 322 and the actuator electrode 352 to be reduced, and the voltage applied to the actuator electrode 352 can thus be reduced.

Moreover, a drive distance of the support thin film 324 is decreased to enhance an operating speed.

In the present embodiment, as the difference of distance between the bonded surfaces of the substrates in the connected parts is corrected in view of the thickness of the aluminum thin film 322, the support thin film 324 and the aluminum thin film 326, the depth of the concave portions (step) is changed correspondingly. That is, the depth of the concave portions (step) is properly changed depending on the place so that all the spaces between the connected parts are uniform.

As measures for differences in shape of the members that decrease the connection probability of the bump, including difference in initial height of the bumps and difference in distance between the connected parts depending on the place, the concave portions are provided to reduce the effect of the difference in the height of the bumps, and the depth of the concave portion is changed depending on the place to solve the difference in distance between the connected parts.

As a result, the electric connection can be ensured in all the connected parts.

The present embodiment is not limited to the configuration described above, and various modifications and alterations may be made.

The various modifications described in the first embodiment can be applied to the materials of the substrate, the bump and the electrode. As also described in the first embodiment, the supersonic waves may be added as required in the hot pressure welding of the substrates. Moreover, the modifications described in the first embodiment can also be applied to the form of the concave portion. Thus, the concave portion may be in the form (the step 142) where the portion lower than the upper surface of the wiring substrate extends to the edge of the wiring substrate as shown in FIG. 3.

A manufacturing process has been shown as an example in the present embodiment wherein the bumps 150 are provided on the side of the wiring substrate 330, but the semiconductor device may be manufactured in a manufacturing process in which the bumps 150 are provided on the side of the switch substrate 310, and the semiconductor device thus manufactured has the same function and advantage as in the present embodiment.

Furthermore, it is preferable to utilize silicon oxide based on SOI or the like for the support thin film, but various materials can be used, such as silicon nitride and a polyimide resist.

Two kinds of depths of the concave portions have been shown as an example in the present embodiment, but it is needless to mention that more depth levels can be provided depending on the shape of the surface of the frame member.

Still further, a representative example of the electrostatically driven MEMS high frequency switch has been shown in the present embodiment, but the present embodiment is applicable to those that can be manufactured by proximately disposing at least two substrates, including other electrostatically driven switches, electromagnetically driven switches, piezoelectrically driven switches and the like.

Fourth Embodiment

The present embodiment is directed to the MEMS deflecting mirror similarly to the first embodiment. FIG. 10 is a sectional view of the MEMS deflecting mirror, which is the semiconductor device in a fourth embodiment of the present invention. In FIG. 10, members indicated by the same reference numerals as those of the members shown in FIG. 1 and FIG. 2 are the same and will not be described in detail.

A semiconductor device 400 of the present embodiment is analogous to the semiconductor device 100 in the first embodiment, and is only different therefrom in that each of the metallic members 150 to bond the mirror substrate 110 and the wiring substrate 130 comprises two bumps, that is, a bump 152 and a bump 154 as shown in FIG. 10.

In the present embodiment, the semiconductor device 400 is manufactured as follows. First, the gold bumps 152 are formed on the parts of the conductive thin film 118 located on the frame member 112 of the mirror substrate 110, and the gold bumps 154 are also formed on the electrodes 134 provided in the concave portions 132 of the wiring substrate 130. Concretely, the gold bumps are preferably formed by use of the bump bonder, which is equipment to form bumps from a gold wire. Then, the mirror substrate 110 and the wiring substrate 130 are positioned so that the gold bumps 152 face the gold bumps 154, and are pressure-welded with heat. Thus the semiconductor device 400 is obtained.

In the present embodiment, the gold bumps are respectively preformed on the conductive thin film 118 of the mirror substrate 110 and the electrodes 134 of the wiring substrate 130. In this case, aluminum may be used for the conductive thin film 118 and the electrodes 134 on the bottom surfaces of the concave portions 132. It has already been commonly known that gold should not preferably be used in the semiconductor process, that is, a MEMS process. The use of aluminum is preferable in this respect.

The substrates are bonded substantially by bonding of the gold bumps, and the gold bumps satisfactorily diffuse heat to each other in the hot pressure welding, so that the mirror substrate 110 and the wiring substrate 130 are more firmly bonded.

In the present embodiment, as each of the metallic members 150 comprise the two bumps, the height is increased, but each of the concave portions 132 may be made deeper to reduce the distance between the substrates.

In the present embodiment, the concave portions are preformed in the wiring substrate, so that securer connection can be accomplished by the bumps than has heretofore been possible, and the mirror substrate 110 and the wiring substrate 130 can be located with a space smaller than the height of the bumps. Further, as the mirror substrate 110 and the wiring substrate 130 can be bonded by the hot pressure welding with the gold bumps without forming gold thin films on the mirror substrate 110 and the wiring substrate 130, thus providing an advantage that gold is not needed in the manufacturing and working processes of the semiconductor substrate itself.

The present embodiment is not limited to the configuration described above, and various modifications and alterations may be made.

The various modifications described in the first embodiment can be applied to the materials of the substrate, the bump and the electrode. As also described in the first embodiment, the supersonic waves may be added as required in the hot pressure welding of the substrates. Moreover, the modifications described in the first embodiment can also be applied to the form of the concave portion. Thus, the concave portion may be in the form (the step 142) where the portion lower than the upper surface of the wiring substrate extends to the edge of the wiring substrate as shown in FIG. 3.

The material of the bumps used in combination for each substrate is not limited to the same material. Various combinations of materials are applicable if the materials allow the bumps to be bonded together. For example, a combination of a gold stud bump and a solder bump manufactured from a solder paste is possible, and they can be bonded with head.

Furthermore, each of the bumps may be not only a two-stage configuration combining two bumps, but also a configuration with three or more stages combining three or more bumps. In addition, three or more kinds of bumps may be provided. In this case, connectivity is not specifically demanded in the bumps that are separate from each other as long as the bumps that contact each other have satisfactory connection, thus enabling various materials to be selected.

Fifth Embodiment

Figure 11:
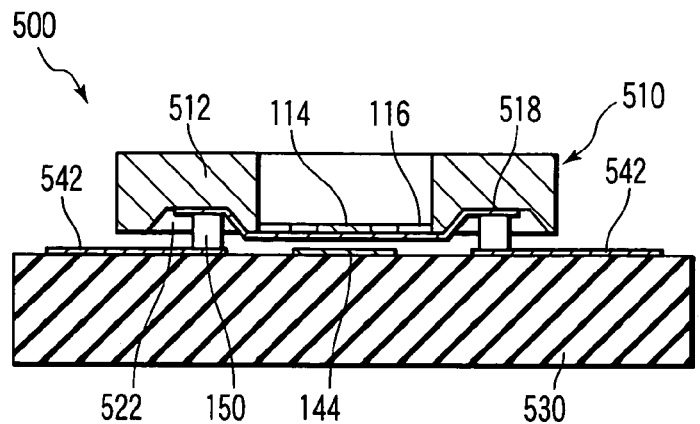
FIG. 11 is a sectional view of the MEMS deflecting mirror, which is the semiconductor device in a fifth embodiment of the present invention.

The present embodiment is directed to the MEMS deflecting mirror similarly to the first embodiment. FIG. 11 is a sectional view of the MEMS deflecting mirror, which is the semiconductor device in a fifth embodiment of the present invention. In FIG. 11, members indicated by the same reference numerals as those of the members shown in FIG. 5 and FIG. 6 are the same.

As shown in FIG. 11, a semiconductor device 500 comprises a mirror substrate 510, a wiring substrate 530 located to face the mirror substrate 510, and the metallic members 150 bonding the mirror substrate 510 and the wiring substrate 530.

The mirror substrate 510 comprises a frame member 512 having an opening, concave portions 522 formed in a surface of the frame member 512 facing the wiring substrate 530, a movable mirror 114 located in the opening of the frame member 512, the hinges 116 connecting the frame member 512 and the movable mirror 114, and a conductive thin film 518 provided on a surface facing the wiring substrate 530.

The mirror substrate 510 is manufactured from a semiconductor material such as silicon in the semiconductor process. The concave portions 522 are formed by wet etching, for example. The conductive thin film 518 is located partially on bottom surfaces of the concave portions 522 formed in the frame member 512.

The wiring substrate 530 has the actuator electrode 144 provided in a part that faces the movable mirror 114 of the mirror substrate 510, and a conductive thin film 542 provided on a surface facing the mirror substrate 510. The wiring substrate 530 is made of, but not specifically limited to, an insulating inorganic material, for example.

In the mirror substrate 510, a part of the conductive thin film 518 located on the movable mirror 114 constitutes a mirror electrode to exert a driving force that swings the movable mirror 114. Parts of the conductive thin film 518 located on the bottom surfaces of the concave portions 522 of the frame member 512 constitute electrodes for electric conduction to the conductive thin film 542 of the wiring substrate 530. The other part of the conductive thin film 518 functions as a wire to electrically connect the mirror electrode on the movable mirror 114 and the electrodes on the bottom surfaces of the concave portions 522.

On the other hand, in the wiring substrate 530, parts of the conductive thin film 542 facing the frame member 512 constitute electrodes for electric conduction to the parts of the conductive thin film 518 located on the bottom surfaces of the concave portions 522 of the frame member 512.

The metallic members 150 have a height greater than the depth of concave portions 522 of the mirror substrate 510. The metallic members 150 are bumps made of, for example, gold, and are provided between parts of the conductive thin film 518 provided on the bottom surfaces of the concave portions 522 of the mirror substrate 510 and the parts of the conductive thin film 542 provided on an upper surface of the wiring substrate 530. The bumps 150 are pressure-welded with heat to electrically and mechanically bond the conductive thin film 518 on the mirror substrate 510 and the conductive thin film 542 on the wiring substrate 530.

Operation of the semiconductor device 500 is totally the same as that of the semiconductor device 100 in the first embodiment and will not be described here.

In the present embodiment, the wiring substrate 530 simply has the actuator electrode 144 and the conductive thin film 542 on the flat upper surface. This means that the processes such as the formation of the concave portions are not needed in the wiring substrate 530. Thus, the wiring substrate 530 does not particularly need to be a semiconductor substrate, and for example, a pyrex glass may suitably be applied in terms of cost. On the other hand, the mirror substrate 510 is made from a silicon substrate as described above.

The mirror substrate 510 and the wiring substrate 530 are thus made of the different materials, and therefore have different thermal expansion coefficients. As a consequence, the bumps are subjected to a shear stress due to a change in outside temperature. However, since the bumps have the height greater than the gap between substrates, the stress is reduced by shear flexure of the bumps. As a result, a highly durable semiconductor device can be obtained.

As described above, the present embodiment can ensure high durability even in a configuration in which the substrates made of different materials are bonded. Moreover, the use of different materials can additionally bring specific effects such as lower costs.

The present embodiment is not limited to the configuration described above, and various modifications and alterations may be made.

The various modifications described in the first embodiment can be applied to the materials of the substrate, the bump and the electrode. As also described in the first embodiment, the supersonic waves may be added as required in the hot pressure welding of the substrates. Moreover, the modifications described in the first embodiment can also be applied to the form of the concave portion. Thus, the concave portion may be in the form (the step 142) where the portion lower than the upper surface of the wiring substrate extends to the edge of the wiring substrate as shown in FIG. 3.

Furthermore, the use of the pyrex glass for the wiring substrate 530 has been shown as an example to reduce costs in the present embodiment, but the material of the wiring substrate 530 is not limited thereto and can be more freely selected, so that various glasses, ceramics or crystalline materials such as alumina, various semiconductors such as GaAs, metallic substrates and the like are applicable.

For example, the material such as GaAs can be used for application to a particular electronic device substrate to provide a durable semiconductor device with higher functions.

A glass epoxy resin substrate, for example, can be applied, but is not entirely preferable because of extremely poor stability in shape caused by temperature and unsecured accuracy of the gap between the substrates.

Sixth Embodiment

Figure 12:
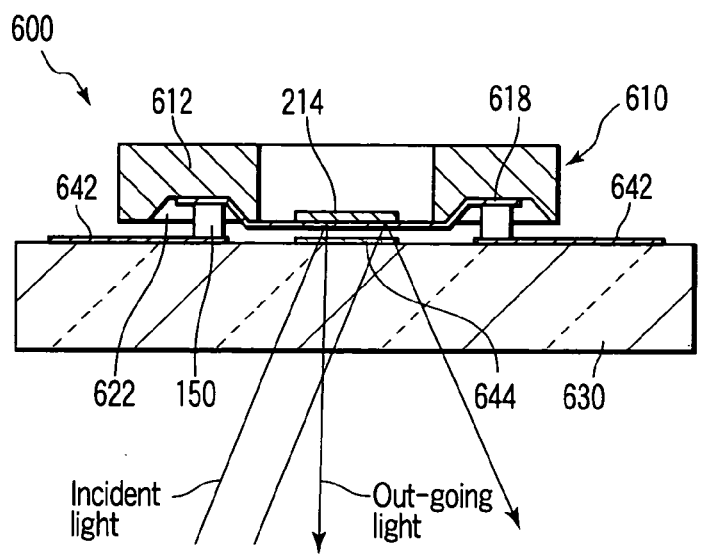
FIG. 12 is a sectional view of the MEMS deformable mirror, which is the semiconductor device in a sixth embodiment of the present invention.
Figure 13:
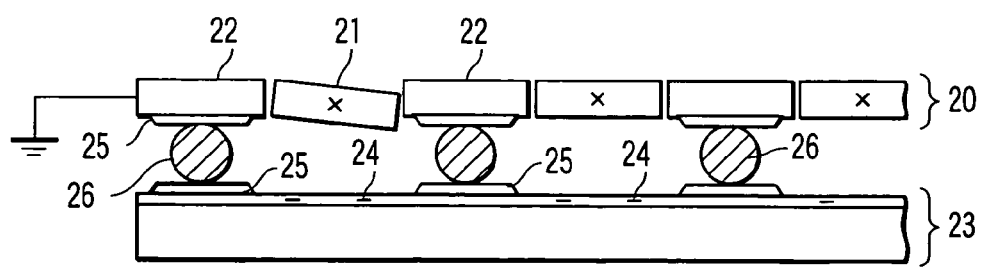
FIG. 13 shows a semiconductor device manufactured by use of a technique disclosed in U.S. Pat. No. 6,519,075,B2.

The present embodiment is directed to the MEMS deformable mirror similarly to the second embodiment. FIG. 12 is a sectional view of the MEMS deformable mirror, which is the semiconductor device in a sixth embodiment of the present invention. In FIG. 12, members indicated by the same reference numerals as those of the members shown in FIG. 5 and FIG. 6 are the same.

As shown in FIG. 12, a semiconductor device 600 comprises a mirror substrate 610, a translucent wiring substrate 630 located to face the mirror substrate 610, and the metallic members 150 bonding the mirror substrate 610 and the translucent wiring substrate 630.

The mirror substrate 610 comprises a frame member 612 having an opening, concave portions 622 formed in a surface of the frame member 612 facing the translucent wiring substrate 630, a deformable mirror 214 located in the opening of the frame member 612, and a conductive thin film 618 connecting the frame member 612 and the deformable mirror 214.

The mirror substrate 610 is manufactured from a semiconductor material such as silicon in the semiconductor process. The concave portions 622 are formed by wet etching, for example. The conductive thin film 618 is located partially on bottom surfaces of the concave portions 622 formed in the frame member 612.

The translucent wiring substrate 630 has a translucent actuator electrode 644 provided in a part that faces the deformable mirror 214 of the mirror substrate 610, and a conductive thin film 642 provided on a surface facing the mirror substrate 610.

The translucent wiring substrate 630 comprises an insulating inorganic material, and is made of, but not specifically limited to, glass, for example. The glass is preferably an optical glass such as BK-7 (manufactured by HOYA-SCHOTT Corporation), a pyrex glass, or the like. Quartz, crystal or the like may be applied depending on a wavelength band of light to be used.

Furthermore, a conductive thin film of, for example, ITO, which is not a specific limitation, is preferably applied to the translucent actuator electrode 644.

In the mirror substrate 610, a part of the conductive thin film 618 located on the deformable mirror 214 constitutes a mirror electrode to exert a driving force that deforms the deformable mirror 214. Parts of the conductive thin film 618 located on the bottom surfaces of the concave portions 622 of the frame member 612 constitute electrodes for electric conduction to the conductive thin film 642 of the translucent wiring substrate 630. The other part of the conductive thin film 618 functions as a wire to electrically connect the mirror electrode on the deformable mirror 214 and the electrodes on the bottom surfaces of the concave portions 622.

On the other hand, in the translucent wiring substrate 630, parts of the conductive thin film 642 facing the frame member 612 constitute electrodes for electric conduction to the parts of the conductive thin film 618 located on the bottom surfaces of the concave portions 622 of the frame member 612.

The metallic members 150 have a height greater than the depth of concave portions 622 of the mirror substrate 610. The metallic members 150 are bumps made of, for example, gold, and are provided between parts of the conductive thin film 642 provided on the bottom surfaces of the concave portions 622 of the mirror substrate 610, and the part of the conductive thin film 642 provided on an upper surface of the translucent wiring substrate 630. The bumps 150 are pressure-welded with heat to electrically and mechanically bond the conductive thin film 618 on the mirror substrate 610 and the conductive thin film 642 on the translucent wiring substrate 630.

In the present embodiment, the mirror substrate 610 and the translucent wiring substrate 630 are made of different materials, and therefore have different thermal expansion coefficients. As a consequence, the bumps are subjected to a shear stress due to a change in outside temperature. However, since the bumps have the height greater than the gap between substrates, the stress is reduced by the shear flexure of the bumps. As a result, a highly durable semiconductor device can be obtained.

Operation of the semiconductor device 600 is the same as that of the semiconductor device 200 in the second embodiment, and by applying a voltage across the deformable mirror 214 and the translucent actuator electrode 644, the electrostatic attraction can be produced to change the curvature of the deformable mirror 214.

Furthermore, because the translucent wiring substrate 630 and the translucent actuator electrode 644 are optically transparent to visible light in the wavelength band of the light to be used, the light can strike on the deformable mirror 214 via the translucent wiring substrate 630 and the translucent actuator electrode 644. In that case, a lower surface of the part of the conductive thin film 618 located on the deformable mirror 214 functions as a reflective surface.

An ordinary electrostatically driven deformable mirror can only deform the reflective surface into a concave surface toward an incident light as disclosed in Jpn. Pat. Appln. KOKAI Publication No. 2-101402.

On the contrary, the MEMS deformable mirror 600 of the present embodiment can also cause the light to enter through the wiring substrate 630, and therefore, can also deform the reflective surface into a convex surface toward the incident light. Thereby, a diverging beam of out-going light can be produced from a parallel beam of incident light.

Naturally, the MEMS deformable mirror 600 of the present embodiment can also deform the reflective surface into a concave surface toward the incident light by causing the light to enter from the opposite side of the wiring substrate 630 in the same manner as the ordinary deformable mirrors.

Furthermore, the translucent wiring substrate 630 can usually be applied as a substitute for a lid called a glass lid or a glass window in an airtight package to directly seal semiconductor elements such as a CPU into a ceramic cavity package, which packages the semiconductor elements, so that it is not necessary to use a window member separately, thus enabling the simplification of the configuration.

Still further, for example, crystal can be applied to the translucent wiring substrate 630 to utilize as a wavelength plate, and a filtering function including an optical thin film can be provided in a surface of the translucent wiring substrate 630.

It is again unnecessary to separately prepare an optical substrate for the optical thin film, and more complex optical functions can be performed with a simple configuration.

As described above, in the present embodiment, high connectivity can be obtained between the substrates, and particularly, the use of the translucent wiring substrate makes it possible to obtain optical characteristics that can not usually be obtained and to obtain complex optical performance with the simple configuration.

As described above, even when the substrates made of different materials are laminated, the present invention can ensure high durability, and, for example, optical properties opposite to ordinary optical properties and particular effects such as lower costs can additionally be obtained by using the translucent material.

The present embodiment is not limited to the configuration described above, and various modifications and alterations may be made.

Since there are materials indicating various translucencies to light of various wavelengths, various materials can be applied to the translucent wiring substrate 630. More specifically, an optical crystal such as optical glass, quartz, crystal, LN, LT or sapphire can be applied to the material of the translucent wiring substrate 630 depending on the wavelength.

Furthermore, other optical functions can also be added, and a photonic crystal or a light guide substrate can be applied to the translucent wiring substrate to add further optical functions.

Moreover, the material of the drive wire is not limited to ITO, and a conductive organic thin film, a silicon thin film or the like can be properly selected depending on the wavelength of the light desired to be used, and such a modification of the shape of the electrode is also effective that the electrode is positioned on a periphery of an optical effective region to avoid a decrease in optical performance.

While the embodiments of the present invention have so far been described with reference to the drawings, the present invention is not limited to these embodiments, and various modifications and alterations may be made without departing from its spirit.

In other words, the above-described embodiments may be properly combined, partially omitted or have various other elements added thereto without changing the spirit and concept of the invention.

For example, not only the two substrates but also more substrates may be bonded to constitute the semiconductor device. The number and location of metallic members used for bonding are properly set as required.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor device comprising:
   a first substrate having first electrodes on at least one surface;
   a second substrate having concave portions on a surface, the concave portions each having one or more flat bottom surfaces, and second electrodes provided on the one or more flat bottom surfaces of the concave portions; and
   metallic members located between the first electrodes of the first substrate and the second electrodes of the second substrate, the metallic members having a height greater than a depth of the concave portions of the second substrate, and electrically and mechanically bonding the first electrodes of the first substrate and the second electrodes of the second substrate;
   wherein one of the first substrate and the second substrate comprises a semiconductor substrate, and the semiconductor substrate has a movable portion that mechanically operates, and a third electrode to exert a driving force that operates the movable portion.

2. The semiconductor device according to claim 1, wherein the first electrodes are located at different heights from the surface of the first substrate, and the concave portions have different depths so that all spaces between the first electrodes and the second electrodes are equal.

3. The semiconductor device according to claim 1, wherein the first substrate and the second substrate are made of materials having different thermal expansion coefficients.

4. The semiconductor device according to claim 1, wherein the material of the second substrate is a semiconductor, and the material of the first substrate is an insulating inorganic material.

5. The semiconductor device according to claim 4, the semiconductor device being directed to an application to an optical system, wherein the material of the first substrate is a material having optical transparency in a wavelength band of light to be used.

6. The semiconductor device according to claim 1, wherein each of the metallic members comprises at least two metallic portions in a direction in which the substrates are spaced.

7. The semiconductor device according to claim 1, wherein the material of the metallic members is gold, and portions near surfaces of the first electrodes and the second electrodes are made of a conductive material that has satisfactory mutual diffusibility with gold when gold is connected to the first electrodes or the second electrodes.

8. The semiconductor device according to claim 7, wherein at least one of the first electrodes and the second electrodes is gold.

9. A The semiconductor device comprising:
a first substrate having first electrodes on at least one surface;
a second substrate having concave portions on a surfaces, the concave portions each having one or more flat bottom surfaces, and second electrodes provided on the one or more flat bottom surfaces of the concave portions; and
metallic members located between the first electrodes of the first substrate and the second electrodes of the second substrate, the metallic members having a height greater than a depth of the concave portions of the second substrate, and electrically and mechanically bonding the first electrodes of the first substrate and the second electrodes of the second substrate;
wherein the first electrodes are located at different heights from the surface of the first substrate, and the concave portions have different depths so that all spaces between the first electrodes and the second electrodes are equal.

10. The semiconductor device according to claim 9, wherein the first substrate and the second substrate are made of materials having different thermal expansion coefficients.

11. The semiconductor device according to claim 9, wherein the material of the second substrate is a semiconductor, and the material of the first substrate is an insulating inorganic material.

12. The semiconductor device according to claim 11, the semiconductor device being directed to an application to an optical system, wherein the material of the first substrate is a material having optical transparency in a wavelength band of light to be used.

13. The semiconductor device according to claim 9, wherein comprise the metallic members comprises at least two metallic portions in a direction in which the substrates are spaced.

14. The semiconductor device according to claim 9, wherein the material of the metallic members is gold, and portions near surfaces of the first electrodes and the second electrodes are made of a conductive material that has satisfactory mutual diffusibility with gold when gold is connected to the first electrodes or the second electrodes.

15. The semiconductor device according to claim 14, wherein at least one of the first electrodes and the second electrodes is gold.

16. A semiconductor device comprising:
a first substrate having first electrodes on at least one surface;
a second substrate having concave portions on a surface, and second electrodes provided on bottom surfaces of the concave portions; and
metallic members located between the first electrodes of the first substrate and the second electrodes of the second substrate, the metallic members having a height greater than a depth of the concave portions of the second substrate, and electrically and mechanically bonding the first electrodes of the first substrate and the second electrodes of the second substrate;
wherein one of the first substrate and the second substrate comprises a semiconductor substrate, and the semiconductor substrate has a movable portion that mechanically operates, and a third electrode to exert a driving force that operates the movable portion.

17. A semiconductor device comprising:
a first substrate having first electrodes on at least one surface;
a second substrate having concave portions on a surface, and second electrodes provided on bottom surfaces of the concave portions; and
metallic members located between the first electrodes of the first substrate and the second electrodes of the second substrate, the metallic members having a height greater than a depth of the concave portions of the second substrate, and electrically and mechanically bonding the first electrodes of the first substrate and the second electrodes of the second substrate;
wherein the first electrodes are located at different heights from the surface of the first substrate, and the concave portions have different depths so that all spaces between the first electrodes and the second electrodes are equal.

* * * * *